United States Patent [19]

Pascucci et al.

[11] Patent Number: 5,493,531

[45] Date of Patent: Feb. 20, 1996

[54] INTEGRATED CIRCUITRY FOR CHECKING THE UTILIZATION RATE OF REDUNDANCY MEMORY ELEMENTS IN A SEMICONDUCTOR MEMORY DEVICE

[75] Inventors: Luigi Pascucci, Sesto San Giovanni; Marco Maccarrone, Palestro, both of Italy

[73] Assignee: SGS-Thomson Microelectronics S.r.l., Milan, Italy

[21] Appl. No.: 350,961

[22] Filed: Dec. 7, 1994

[30] Foreign Application Priority Data

Dec. 9, 1993 [EP] European Pat. Off. .............. 93830493

[51] Int. Cl.$^6$ .............................. G11C 7/00; G11C 29/00
[52] U.S. Cl. ..................... 365/200; 365/201; 365/230.06
[58] Field of Search ..................... 365/200, 201, 365/189.05, 230.06, 189.07; 371/10.2, 10.3

[56] References Cited

U.S. PATENT DOCUMENTS

| 4,586,170 | 4/1986 | O'Toole et al. ............... 365/200 |
| 5,124,949 | 6/1992 | Morigami .................. 365/200 X |

FOREIGN PATENT DOCUMENTS 4226070  6/1993  Germany .

WO82/02793  8/1992  WIPO .

Primary Examiner—Joseph A. Popek
Attorney, Agent, or Firm—David V. Carlson; Bryan A. Santarelli; Seed and Berry

[57] ABSTRACT

An integrated circuit for checking the utilization rate of redundancy memory elements in semiconductor memory device, comprising a matrix of memory elements and a redundancy circuitry which comprises a plurality of programmable non-volatile memory registers, each supplied with address signals to generate a redundancy selection signal for the selection of an associated redundancy memory element when the address signals coincide with the address stored therein, and combinatorial circuit means supplying the non-volatile memory registers with an inhibition signal for inhibiting the generation of the respective redundancy selection signals when the address signals coincide with the address stored in a non-programmed non-volatile memory register; the integrated circuitry comprises multiplexing circuit means, controlled by a control signal generated by a control circuitry of the memory device, for transmitting the redundancy selection signals to output pads of the memory device when the control signal is activated; the control signal is also supplied to said combinatorial circuit means to prevent when activated the generation of said inhibition signal.

20 Claims, 3 Drawing Sheets

INTEGRATED CIRCUITRY FOR CHECKING THE UTILIZATION RATE OF REDUNDANCY MEMORY ELEMENTS IN A SEMICONDUCTOR MEMORY DEVICE

TECHNICAL FIELD

The present invention relates to an integrated circuitry for checking the utilization rate of redundancy memory elements in a semiconductor memory device.

BACKGROUND OF THE INVENTION

In the manufacture of semiconductor memories defects are frequently encountered that afflict a limited number of memory elements in a memory matrix. The reason for the high probability of defects of this type resides in that in a semiconductor memory device the greatest part of the chip area is occupied by the memory matrix; moreover, it is in the memory matrix, and not in the peripheral circuitry, that the manufacturing process characteristics are usually pushed to limits.

In order to avoid that the presence of a limited number of defective matrix memory elements on many millions forces the rejection of the entire chip, and therefore to increase the manufacturing process yield, the technique is known of providing for the manufacture of a certain number of additional memory elements, commonly called "redundancy memory elements," to be used as a replacement of those matrix memory elements that, during testing of the memory device, prove defective; the selection circuits, with which the integrated component must necessarily be provided, and which allow the above-mentioned functional replacement of a defective matrix memory element with a redundancy memory element are indicated as a whole with the name of "redundancy circuitry," while the set of redundancy memory elements and circuitry is defined for short as "redundancy."

The redundancy circuitry comprises programmable non-volatile memory registers suitable to store those address configurations corresponding to the defective matrix memory elements; such registers are programmed once and for all during the memory device testing, and must retain the information stored therein even in absence of the power supply.

Each non-volatile memory register must therefore be made up of a number of programmable memory cells at least equal to the number of address bits which allows the selection of the matrix memory elements. Each memory cell of a memory register is therefore dedicated to store the logical state of a particular address bit of the address configuration corresponding to a defective matrix memory element, and comprises at least one programmable non-volatile memory element, a circuit for programming the memory element, a circuit for reading the information stored in the memory element and a circuit for comparing said information with the current logical state of the address bit associated to the memory cell.

Since however even unprogrammed non-volatile memory registers, associated to unused redundancy memory elements, store a particular address configuration, i.e., they store that particular address configuration corresponding to the unprogrammed condition of the memory cells, when a non-defective matrix memory element is addressed whose address coincides with the logical configuration of the memory cells in an unprogrammed memory register, the redundancy memory element associated to said unprogrammed register will be selected instead of the non-defective matrix memory element. If in a memory device two or more redundancy memory elements are not used, since the unprogrammed condition is the same for all the memory cells of the non-volatile memory registers, addressing the non-defective matrix memory element whose address coincides with the configuration of the unprogrammed memory cells would cause said two or more redundancy memory elements to be selected simultaneously.

To prevent such unacceptable simultaneous selection, each non-volatile memory register is provided with an additional programmable memory cell (called "guard memory cell" or "control memory cell") which allows the selection of the associated redundancy memory element only in the case it is programmed. This however causes a significant increase in the overall chip area.

In order to evaluate the degree of defectiveness of the manufacturing process, or of a given fabrication lot of memory device chips, it is useful to know for each chip how many redundancy memory elements have been utilized to replace defective matrix memory elements, in other words to perform a "resources check."

According to a known technique, this can be done by putting the memory device in a particular test mode in which all the selection signals for the redundancy memory elements generated by the non-volatile memory registers are ORed together and the resulting signal is supplied to one output buffer driving an output pad of the memory device; the memory device is then sequentially supplied with all the possible address configurations; each time an address configuration corresponding to a defective matrix memory element which has been replaced by a redundancy memory element is supplied to the memory device, the corresponding non-volatile register will activate the selection signal for the redundancy memory element, and this occurrence will be detected by the testing machine by sensing the logical state of said output pad. A given non-volatile memory register will activate the corresponding selection signal only if the current address configuration supplied to the memory device coincides with that stored in it, and if the respective guard memory cell is programmed.

This is a lengthy procedure, especially for dense memory devices, wherein the possible address configurations can be several millions; furthermore, the testing machine must keep track of the number of times the output pad changes its logical state.

In the copending European Patent Application No. 93830491.2 in the name of the same Applicant, a redundancy circuitry is described wherein no guard memory cells are required in the non-volatile memory registers; this is achieved by means of the generation of an inhibition signal which inhibits the activation of the selection signals for the redundancy memory elements each time the memory device is supplied with an address configuration coincident with the logical state stored in a non-programmed non-volatile memory register.

SUMMARY OF THE INVENTION

An object of the present invention is to realize an integrated circuitry for checking the utilization rate of redundancy memory elements in a semiconductor memory device, which is suitable for being used in conjunction with a redundancy circuitry in which no guard memory cells are provided to the non-volatile memory registers, and which allows a reduction in the time requested by a testing machine to carry out the resources check operation.

According to the present invention, such object is attained by means of an integrated circuit for checking the utilization rate of redundancy memory elements in a semiconductor memory device, comprising a matrix of memory elements and a redundancy circuitry which comprises a plurality of programmable non-volatile memory registers, each of which is programmable to store an address of a defective memory element in the matrix which must be replaced by the redundancy memory element associated to the non-volatile register and is supplied with address signals to generate a redundancy selection signal for the selection of the associated redundancy memory element when said address signals coincide with the address stored therein, combinatorial circuit means supplied with said address signals and supplying the nonvolatile memory registers with an inhibition signal for inhibiting the generation of the respective redundancy selection signals when said address signals coincide with the address stored in a non-programmed non-volatile memory register, characterized in that it comprises multiplexing circuit means, controlled by a control signal generated by a control circuitry of the memory device, for transmitting said redundancy selection signals to output pads of the memory device when said control signal is activated, said control signal being also supplied to said combinatorial circuit means to prevent when activated the generation of said inhibition signal.

Based on one advantage of the present invention, it is possible for a testing machine to perform a "resources check" operation of a memory device by just supplying it with an address configuration coincident with the address stored in a non-programmed non-volatile memory register of the redundancy circuitry, and by sensing the logical state of the output pads of the memory device. The time required to carry out the "resources check" is thus greatly reduced, since it is not necessary to sequentially supply the memory device with all the possible address configurations. As already described, "resources check" is useful to assess the technological degree of defectiveness, for statistical analysis regarding the average use of redundancy memory elements, so that the number of such elements can be optimized, and to analyze the existence of local critical states.

BRIEF DESCRIPTION OF THE DRAWINGS

The features of the present invention will be made more evident by the following detailed description of two particular embodiments, illustrated as non-limiting examples in the annexed drawings, wherein.

DETAILED DESCRIPTION OF THE INVENTION

Figure 1:
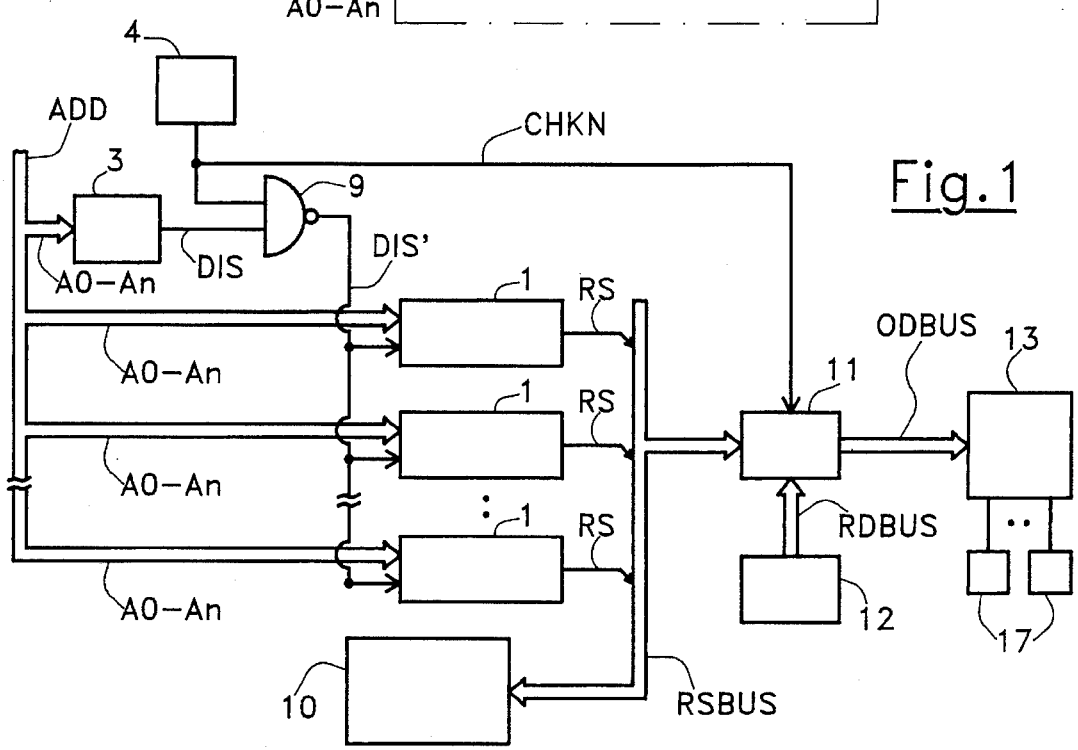
FIG. 1 is an electrical schematic diagram of a part of a semiconductor memory device with an integrated circuitry according to a first embodiment of the present invention.

As shown in FIG. 1, a semiconductor memory device according to a first embodiment of the present invention comprises a redundancy circuitry which is integrated in a memory device chip and comprises a plurality of non-volatile memory registers 1, each associated to a respective redundancy memory element (not shown).

In practical implementations of redundancy, providing for the existence of rows ("word lines") or columns ("bit lines") or both rows and columns of redundancy memory elements, each non-volatile memory register 1 has associated with it a respective redundancy row or column. The details of the redundancy cells themselves are not of concern to the present invention, and in the following description it will be assumed that each non-volatile memory register 1 has associated with it a redundancy memory element.

As also shown in FIG. 1, each non-volatile memory register 1 is supplied with address signals A0–An, taken from an address signals bus ADD; the address signals bus ADD also supplies decoding circuits (not shown) for the selection of a particular memory element in the memory matrix.

Figure 2:
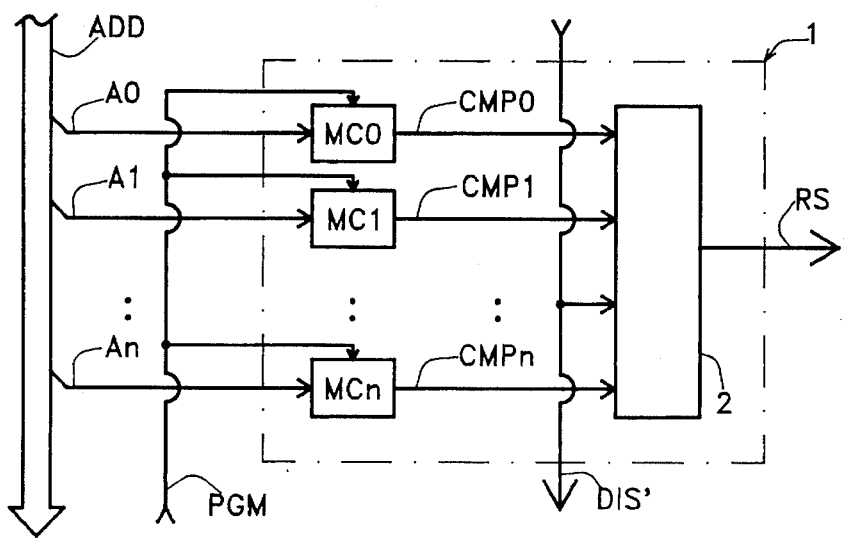
FIG. 2 is an electrical schematic diagram of a non-volatile memory register tier a redundancy circuitry of the semiconductor memory device of FIG. 1.
Figure 3:
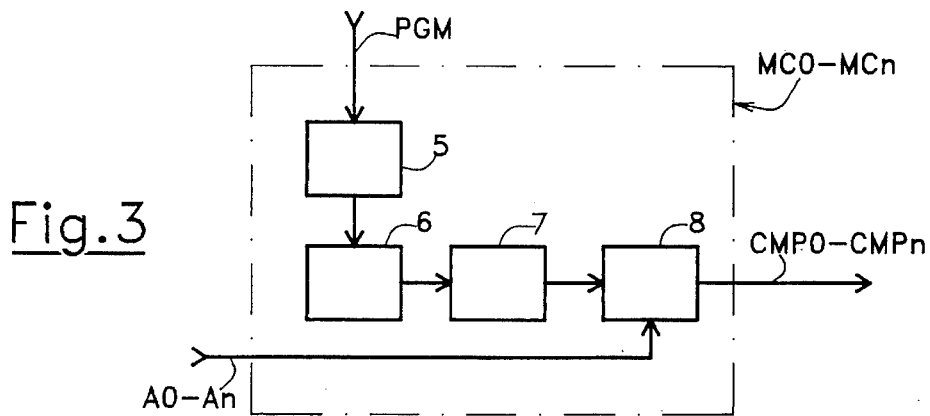
FIG. 3 is a schematic block diagram of a memory cell of the non-volatile memory register of FIG.2.

As shown in FIG. 2, each non-volatile memory register 1 comprises a plurality of programmable non-volatile memory cells MC0–MCn; each of said cells MC0–MCn is supplied with one of the address signals A0–An and comprises in a per-se known way, as shown in FIG. 3, at least one programmable non-volatile memory element 6, a first circuit 5 for programming said memory element 6, a second circuit 7 for reading the information stored in the non-volatile memory element 6 and a third circuit 8 for comparing said information with the current logical state of the respective address signal A0–An. All the memory cells MC0–MCn of a given non-volatile memory register 1 are also supplied with a signal PGM (not shown in FIG. 1) supplied by a control circuitry 4 of the memory device to enable the programming of the memory element 6; different non-volatile memory registers 1 are supplied with different signals PGM, so that one register 1 is programmable at a time. The control circuit 4 is a logic control circuit of any suitable type, many being well known in the art. The circuit 4 includes those circuits generally provided on a memory to control their operating modes. In the simplest case, the control circuit 4 is comprised of logic gates which, according to voltage levels present on certain external pins or input signal lines, enable various modes of the memory, such as the programming mode, the read mode, a factory specified test mode, or the like. The exact structure and specific functions of the circuit 4 will vary from chip to chip and can be quite complex. However, such control circuitry is part of memory chips today and those with skill in the art will be able to select or design such a circuit for each memory chip using known circuits and general background knowledge based on the use of circuit 4 as described herein.

Each memory cell MC0–MCn has an output signal CMP0–CMPn which is activated whenever the current logical state of the respective address signal A0–An coincides with the logical state stored in the non-volatile memory element 6 of the cell MC0–MCn.

Each non-volatile memory register 1 further comprises a redundancy memory element selection circuit 2 which is supplied with all the signals CMP0–CMPn and generates a signal RS used to select one redundancy memory element and to deselect a defective matrix memory element whose address coincides with the address contiguration stored in the non-volatile register 1.

The redundancy circuitry also comprises a combinatorial circuit 3 supplied with the address signals A0–An and generating a signal DIS which forms one input of a NAND gate 9; a second input of the NAND gate 9 is supplied with a signal CHKN which is generated by the control circuitry 4. An output signal DIS' of the NAND gate 9 is individually supplied to all the redundancy memory element selection circuits 2 of the non-volatile memory registers 1.

Figure 4:
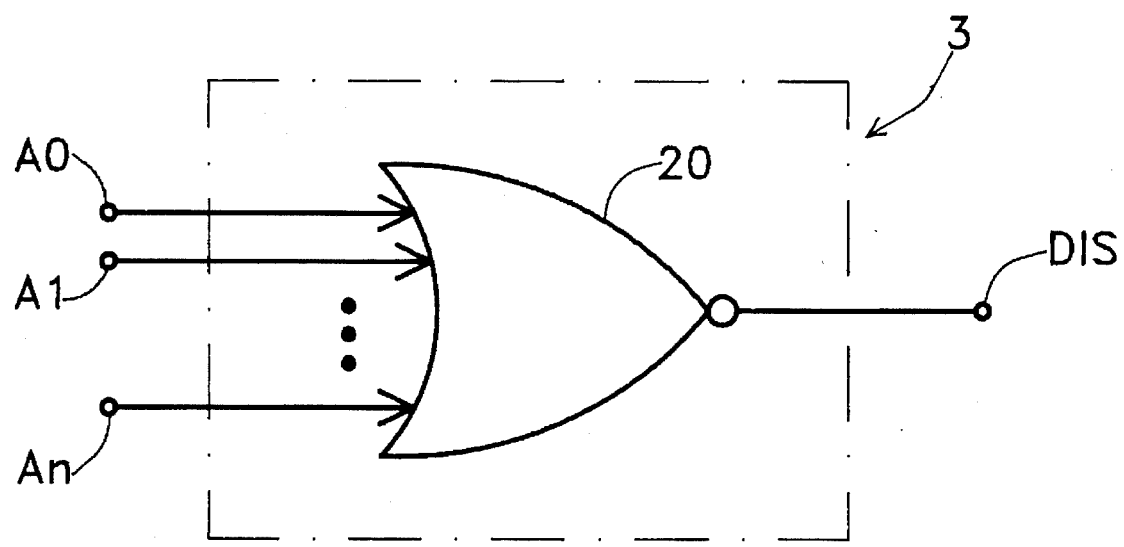
FIG. 4 is a schematic diagram of the combinational circuit of FIG. 1.
Figure 5:
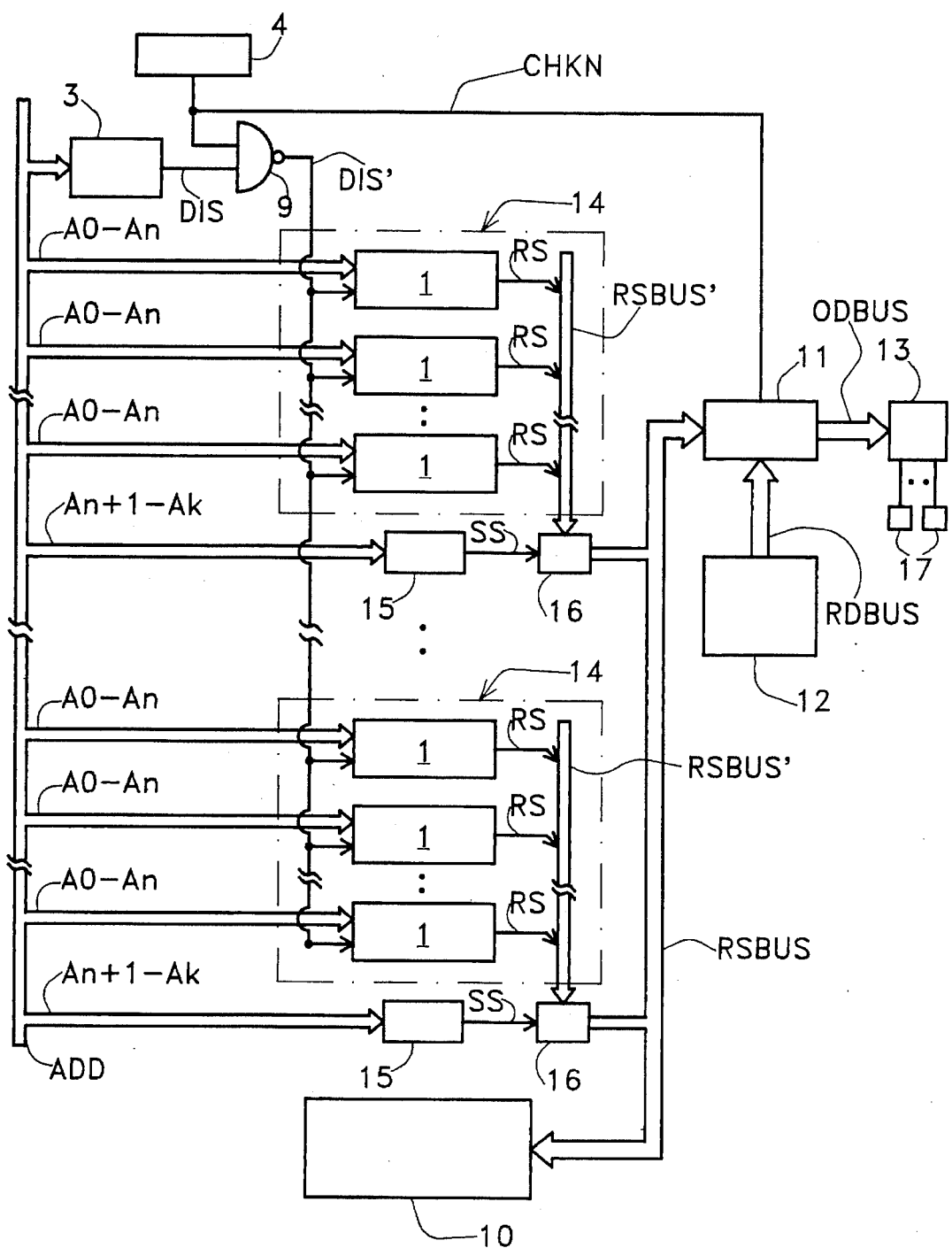
FIG. 5 is an electrical schematic diagram of a part of a semiconductor memory device with an integrated circuitry according to a second embodiment of the invention.

FIG. 4 shows one example of combinatorial circuit 3, which generates signal DIS when address bus A0–An carries the selected address corresponding to that stored in the unprogrammed non-volatile registers 1. Circuit 3 includes an n-input NOR gate 20, which generates a high logic state at its output when a low logic state is simultaneously present on all its inputs. Some or all of the inputs may include inverters, which may either be integral with NOR gate 20 or external thereto. The pattern of inverters determines the selected address, which when present on the address bus will cause NOR gate 20 to generate at its output a high logic state, i.e., activate DIS. In the example shown in FIG. 4, no inverters are used; thus, address 0 is the selected address stored in the unprogrammed registers 1. Although shown as a NOR gate, combinatorial circuit 3 may be formed from other circuits without departing from the spirit and scope of the invention.

Referring again to FIG. 1, control circuit 4 generates CHKN according to voltage signals present on external mode pins of the memory chip. Modes controlled by these external mode pins may include programming and various factory and field test modes. As discussed above control circuits that can be used for control circuit 4 are known in the art.

All the output signals RS of the non-volatile memory registers 1 are grouped together to form a redundancy selection signals bus RSBUS; this bus is normally provided in the memory device, wherein it runs from the non-volatile registers 1 to the memory matrix 10 wherein the redundancy memory elements are physically obtained.

The redundancy selection signals bus RSBUS also supplies a first input channel of a multiplexing circuit 11; a second input channel of the multiplexing circuit 11 is supplied with a read data bus RDBUS in which all the signals generated by a per-se known sensing circuitry 12 are grouped together; the sensing circuitry 12 is used to read the information stored in the addressed memory elements when the memory device is operated in reading condition. An output channel of the multiplexing circuit 11 is connected to an output data bus ODBUS which supplies a buffer circuitry 13; each signal in the ODBUS supplies a respective output buffer in the buffer circuitry 13; each output buffer drives a respective output pad 17 of the memory device. The signal CHKN also constitutes a control signal for the multiplexing circuit 11: when CHKN is activated, the output channel of the multiplexing circuit 11 is connected to the first input channel, so that the selection signal bus RSBUS is transmitted to the buffer circuitry 13; when instead CHKN is not activated, the output channel of the multiplexing circuit 11 is connected to the second input channel, so that the read data bus RDBUS is transmitted to the buffer circuitry.

At the end of the manufacturing process of the memory device, all the programmable non-volatile memory elements 6 included in the memory cells MC0–MCn of all the non-volatile memory registers 1 are in a well-known and defined logical state, i.e., in the virgin or non-programmed state.

During the memory device testing, the address configurations corresponding to defective matrix memory elements are programmed into respective non-volatile memory registers 1; each time a defective matrix memory element is encountered, the testing machine puts the memory device in a condition such that the control circuitry 4 activates one signal PGM, to enable the programming of the memory cells MC0–MCn of a given non-volatile memory register 1; in this way any successive attempt to address said defective matrix memory element will automatically cause a redundancy memory element to be addressed. At the end of this phase, it is possible that some redundancy memory elements are left unused, and the associated non-volatile memory registers 1 are therefore left in their unprogrammed state.

When the memory is operated in normal reading condition, the control circuitry 4 keeps the signal CHKN in the high logical level; in such condition, the logical state of the signal DIS' at the output of the NAND gate 9 depends on the logical state of the signal DIS, as will be explained later on; the output channel of the multiplexing circuit 11 is connected to the second input channel, i.e., the output data bus ODBUS is connected to the read data bus RDBUS, so that the data stored in the addressed matrix memory elements read by the sensing circuitry 12, are transferred to the buffer circuitry 13 and then to respective output pads 17. If a defective matrix memory element is addressed, the non-volatile register 1 wherein its address has been programmed during testing recognizes such address and activates the signal RS, to deselect the defective matrix memory element and simultaneously to select a redundancy memory element. If the current address configuration supplied to the memory device coincides with the address stored in a non-programmed non-volatile memory register, the combinatorial circuitry 3 recognizes the event and activates the signal DIS; this in turn causes the signal DIS' to be activated, so that the activation of all the signals RS is inhibited. This prevents, if two or more non-programmed non-volatile memory registers 1 are present in the memory device, the associated redundancy memory elements from being simultaneously selected.

If it is desired to perform a "resources check" for the memory device, this must be put in the testing environment; the testing machine puts the memory device in a particular test mode in which the control circuitry 4 drives the signal CHKN to the low logical state; this causes the signal DIS' to go to the high logical state, independently of the state of the signal DIS, and also causes the output channel of the multiplexing circuit 11 to be connected to the redundancy selection signals bus RSBUS. The memory device is then supplied with an address configuration A0–An coincident with the logical state stored in non-programmed non-volatile registers 1. Even if such address configuration is recognized by the combinatorial circuitry 3, the activation of the signal DIS' is inhibited; all the non-programmed non-volatile registers 1, associated to unused redundancy memory elements, will therefore activate the respective signal RS; the programmed non-volatile registers 1, associated to redundancy memory elements which have been utilized to replace defective matrix memory elements, will instead not activate the respective signals RS. The number of activated signals in the RSBUS will therefore correspond to the number of unused redundancy memory, elements. Since the activation of the CHKN signal has caused the output channel of the multiplexing circuit 11 to be connected to the RSBUS, this will be transmitted to the buffer circuitry 13, and hence to the output pads 17. Each signal in the RSBUS is thus associated to a respective output pad 17, and it is therefore possible for the testing machine, by sensing the logical state of the output pads 17, to know which and how many unused redundancy memory elements are present in the memory device.

In the described embodiment, the number of signals in the ODBUS must be at least equal to the number of signals in the RSBUS, i.e., to the number of redundancy memory elements. It is however possible, with minor modifications, to utilize the structure according to the invention even in the case the number of redundancy memory elements is greater than the number of signals available in the ODBUS of the memory device; this can be done for example by splitting the RSBUS into two distinct buses, and using a multiplexing circuit with three input channels; for the selection of which of the input channels must be connected to the output channel (i.e., to the ODBUS), the control circuitry 4 must in this case supply the multiplexing circuit with two distinct signals, instead of the single signal CHKN. To carry out the "resources check" operation, the signals of the two redundancy selection signals buses are sequentially supplied to the buffer circuitry 13.

In FIG. 4 a second embodiment of the invention is shown, suitable for a memory device in which the memory matrix is divided in sectors individually addressable; such architecture is used for example in Flash EEPROM devices. Each sector is provided with redundancy memory elements; to increase the reparability rate, and thus the process yield, defective matrix memory elements in a given sector can be replaced with a redundancy memory element without causing non-defective matrix memory elements of other sectors having identical addresses to be simultaneously replaced with the redundancy memory element. This is obtained by providing each sector with a respective set 14 of non-volatile memory registers, and by submitting the selection of a redundancy memory element to a sector address decoding.

As shown in FIG. 4, each set 14 comprises an equal number of nonvolatile memory registers 1, supplied with address signals A0–An which also supplies a decoding circuitry (not shown) for the selection of a particular matrix memory element in each sector. All the output signals RS of the non-volatile registers 1 of a given set are grouped together to form a local redundancy selection signals bus RSBUS', which is supplied to an input channel of a multiple switch 16; the output channel of the multiple switch 16 is connected to the redundancy selection signals bus RSBUS, already encountered in the description of the previous embodiment. Each multiple switch 16 is controlled by a signal SS supplied by a sector address decoding and selection circuit 15 which is supplied by sector address signals An+1–Ak taken from the address signals bus ADD.

During a "resources check," the control circuitry 4 drives the signal CHKN to the low logical state, and the activation of the signal DIS' is therefore disabled; the multiplexing circuit 11 connects the RSBUS to the ODBUS, and thus to the buffer circuitry 13.

The memory device is then supplied with an address configuration wherein the address signals A0–An are in a logical state coincident with the logical state stored in non-programmed non-volatile registers 1; all the non-programmed nonvolatile registers 1 in all the sets 14 will therefore activate their output signals RS; the sector address signals An+1–Ak are sequentially changed to address one different sector at a time, so that only one RSBUS' is connected, via the respective multiple switch 16, to the RSBUS. By sensing the logical state of the output pads 17, it is thus possible to know which and how many redundancy memory elements in each sector have not been utilized to replace defective matrix memory elements.

We claim:

1. Integrated circuitry for checking the utilization rate of redundancy memory elements in a semiconductor memory device, comprising a matrix of memory elements and redundancy circuitry which comprises a plurality of programmable non-volatile memory registers, each of which is programmable to store an address of a defective memory element in the matrix which must be replaced by the redundancy memory element associated to the non-volatile register and is supplied with address signals to generate a redundancy selection signal for the selection of the associated redundancy memory element when said address signals coincide with the address stored therein, combinatorial circuit means supplied with said address signals and supplying the non-volatile memory registers with an inhibition signal for inhibiting the generation of the respective redundancy selection signals when said address signals coincide with the address stored in a non-programmed non-volatile memory register, characterized in that it comprises multiplexing circuit means, controlled by a control signal generated by a control circuitry of the memory device, for transmitting said redundancy selection signals to output pads of the memory device when said control signal is activated, said control signal being also supplied to said combinatorial circuit means to prevent when activated the generation of said inhibition signal.

2. Integrated circuitry according to claim 1, characterized in that when said control signal is disactivated said multiplexing circuit means transmit to said output pads signals generated by a sensing circuitry for reading the memory elements in the matrix.

3. Integrated circuitry according to claim 1, said matrix of memory elements being divided in individually addressable matrix sectors, each sector being provided with respective redundancy memory elements associated to respective non-volatile memory registers in the redundancy circuitry, characterized in that said integrated circuitry comprises sector selection circuit means supplied with sector address signals and generating sector selection signals controlling switching means supplied with all said redundancy selection signals and supplying said multiplexing circuit means with a set of said selection signals which are generated by the non-volatile memory registers associated to redundancy memory elements of the sector currently addressed.

4. Integrated circuitry according to claim 1 or 2, characterized in that each programmable non-volatile memory register comprises a number of programmable memory cells equal to the number of said address signals, each memory cell being supplied with one address signal and generating an output signal when the logical state of said address signal correspond to the logical state stored in the memory cell, each non-volatile memory register further comprising selection circuit means supplied with the output signals of the memory cells for generating said redundancy selection signal, said selection circuit means being also supplied with said inhibition signal which prevent when activated the generation of said redundancy selection signal.

5. Apparatus for providing the number of redundancy memory cells selected to replace defective memory cells in a memory matrix that has at least one sector and is in communication with an output data bus and an address bus having cell and sector address portions, comprising;

a first redundancy address cell associated with a first one of said redundancy memory cells and operable to store a default address until programmed with an address of a first defective memory cell in a first sector of said matrix having a first sector address;

a first selection circuit operable to generate a first redundancy select signal when the address stored in said first redundancy address cell occupies said cell address portion of said address bus;

a control circuit operable to generate a check-number signal during a check-number mode; and a multiplexer operable to couple said redundancy select signal to said output data bus in response to said check-number signal.

6. The apparatus of claim 5, further comprising:
a combinatorial circuit operable to generate a disable signal that disables said selection circuit when said default address occupies said cell address portion of said address bus; and
wherein said check-number signal disables said combinatorial circuit during said check-number mode.

7. The apparatus of claim 5, further comprising:
a second redundancy address cell associated with a second one of said redundancy memory cells and operable to store said default address until programmed with an address of a second defective memory cell in a second sector of said matrix having a second sector address;
a second selection circuit operable to generate a second redundancy select signal when the address stored in said second redundancy address cell occupies said cell address portion of said address bus; and
a switch circuit operable to couple said first redundancy signal to said multiplexer when said first sector address occupies said sector portion of said address bus and operable to couple said second redundancy signal to said multiplexer when said second sector address occupies said sector portion of said address bus.

8. Method for providing the number of redundancy memory cells selected to replace defective memory cells in a memory matrix that has at least one sector and is in communication with an output data bus and an address bus having cell and sector address portions, comprising;
storing a default address in a first redundancy address cell associated with a first one of said redundancy memory cells until said address cell is programmed with an address of a first defective memory cell in a first sector of said matrix having a first sector address;
generating a first redundancy select signal when the address in said first redundancy address cell occupies said cell address portion of said address bus;
generating a check-number signal to indicate a check-number mode; and
coupling said redundancy select signal to said output data bus during said check-number mode.

9. The method of claim 8, further comprising generating a disable signal except during said check-number mode for disabling said selection circuit when said default address occupies said cell address portion of said address bus.

10. The method of claim 8, further comprising:
storing said default address in a second redundancy address cell associated with a second one of said redundancy memory cells until said second redundancy address cell is programmed with an address of a second defective memory cell in a second sector of said matrix having a second sector address;
generating a second redundancy select signal when the address stored in said second redundancy address cell occupies said cell address portion of said address bus;
coupling said first redundancy signal to said output data bus when said first sector address occupies said sector portion of said address bus; and
coupling said second redundancy signal to said output data bus when said second sector address occupies said sector portion of said address bus.

11. The method of claim 8, further comprising:
driving said cell address portion of said data bus with said default address during said check number mode; and
counting the number of redundancy selection signals occupying said output data bus during said check number mode.

12. The method of claim 11, further comprising subtracting said number of redundancy selection signals from the total number of redundancy memory cells to calculate said number of selected redundancy memory cells.

13. A memory circuit comprising:
an address bus;
an output data bus;
a memory matrix having at least one sector of memory cells and redundancy memory cells operable to replace defective ones of said memory cells;
redundancy address cells each associated with one of said redundancy memory cells and operable to store a default address until programmed with an address of a first defective memory cell;
selection circuits each operable to generate a redundancy selection signal when the address stored in an associated one of said redundancy address cells occupies said address bus;
a control circuit operable to generate a check number signal during a check number mode of the memory circuit; and
a multiplexer operable to receive said check number signal and to couple said redundancy selection signals to said output data bus during said check number mode, and to couple a selected memory or redundancy memory cell from said memory matrix to said output data bus during an operational mode of the memory circuit.

14. The memory circuit of claim 13, further comprising a combinatorial circuit operable to receive said check number signal and except during said check number mode generate a disable signal that disables said selection circuits when said default address occupies said address bus.

15. The memory circuit of claim 14 wherein said combinatorial circuit further comprises:
an address decoder operable to generate a detect signal when said default address occupies said address bus; and
a NAND gate operable to receive said detect and check number signals and to generate said disable signal.

16. The memory circuit of claim 13, further comprising a redundancy-signal bus to couple said redundancy signals from said selection circuits to said redundancy memory cells and said multiplexer.

17. The memory circuit of claim 16, further comprising:
said address bus having a cell address portion and a sector address portion; and
a switch circuit operable to couple those of said redundancy selection signals from redundancy address cells in a first sector of said memory matrix to said redundancy-signal bus when a first sector address occupies said sector portion of said address bus, and operable to couple those of said redundancy selection signals from redundancy address cells in a second sector of said memory matrix to said redundancy-signal bus when a second sector address occupies said sector portion of said address bus.

18. The memory circuit of claim 13 wherein each of said redundancy address cells comprises:
a programmable, nonvolatile memory element;

a first circuit operable to receive a program signal and to program said memory element with a portion of the address of a defective memory cell;

a second circuit operable to read said address portion from said memory element: and a third circuit operable to compare said address portion from said memory element with a corresponding address portion occupying said address bus and to generate a compare signal if said address portions are equivalent.

19. The memory circuit of claim 18 wherein said control circuit generates said program signal.

20. The memory circuit of claim 18 wherein each of said selection circuits is operable to receive compare signals associated with one of said redundancy address cells and to generate a corresponding redundancy selection signal therefrom.

* * * * *